United States Patent
Bacchi et al.

[11] Patent Number: 6,160,265
[45] Date of Patent: Dec. 12, 2000

[54] SMIF BOX COVER HOLD DOWN LATCH AND BOX DOOR LATCH ACTUATING MECHANISM

[75] Inventors: Paul Bacchi, Novato; Paul S. Filipski, Greenbrae, both of Calif.

[73] Assignee: Kensington Laboratories, Inc., Richmond, Calif.

[21] Appl. No.: 09/141,890

[22] Filed: Aug. 27, 1998

Related U.S. Application Data

[60] Provisional application No. 60/092,626, Jul. 13, 1998.

[51] Int. Cl.[7] ..................................................... G01V 8/00
[52] U.S. Cl. ............................... 250/559.29; 250/559.37; 414/937
[58] Field of Search ......................... 250/559.29, 559.37, 250/559.33, 559.3, 548, 221; 356/375, 399–401; 414/937, 936, 939, 331, 332, 335

[56] References Cited

U.S. PATENT DOCUMENTS

| | | | |
|---|---|---|---|
| 4,746,256 | 5/1988 | Boyle et al. | 414/217 |
| 4,803,373 | 2/1989 | Imamura et al. | 250/559.29 |
| 4,815,912 | 3/1989 | Maney et al. | 414/217 |
| 4,995,430 | 2/1991 | Bonora et al. | 141/98 |
| 5,382,806 | 1/1995 | Bacchi et al. | |

OTHER PUBLICATIONS

SEMI E19.4–94 (1992, 1996), 200 mm Standard Mechanical Interface [Month Unknown].

Primary Examiner—Que T. Le
Attorney, Agent, or Firm—Stoel Rives LLP

[57] ABSTRACT

A SMIF box cover hold down latch and box door latch actuating mechanism installed in the port door of a SMIF system has two box door latch actuating pins extending from a central pivot shaft of the actuating mechanism to mate with corresponding holes in the cam component of the box door latch mechanism. In a preferred embodiment the central pivot shaft moves about a central pivot axis between first and second predetermined angular positions. Movement to the first angular position imparts linear movement of trucks attached to first and second rod members and causes push pins to retract from their corresponding box cover hold down latches to secure the box cover to the port plate and imparts angular movement to the two actuating pins and causes them to operate the box door latch mechanism to release the box door from the box cover. Movement to the second angular position imparts linear movement to trucks attached to first and second rod members and causes push pins to extend toward and contact their corresponding box cover hold down latches to release the box cover from the port plate and imparts angular movement to the two actuating pins and causes them to operate the box door latch mechanism to secure the box door to the box cover. Multiple wafer registration detector subassemblies ensure that semiconductor wafers stored in a cassette holder contained within the SMIF box are properly registered before an elevator assembly moves the cassette holder beneath a SMIF system processing station canopy.

2 Claims, 10 Drawing Sheets

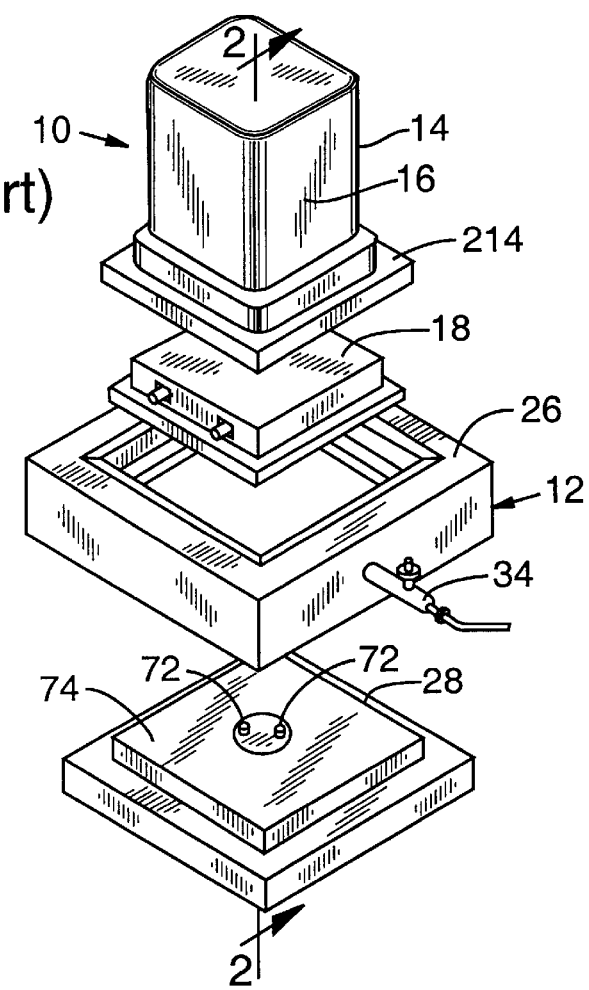
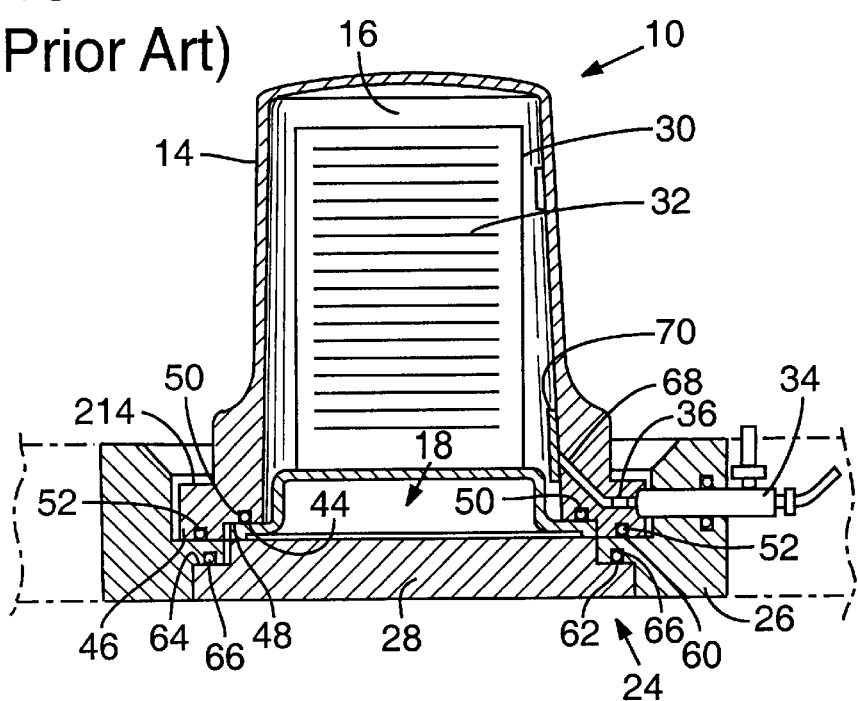

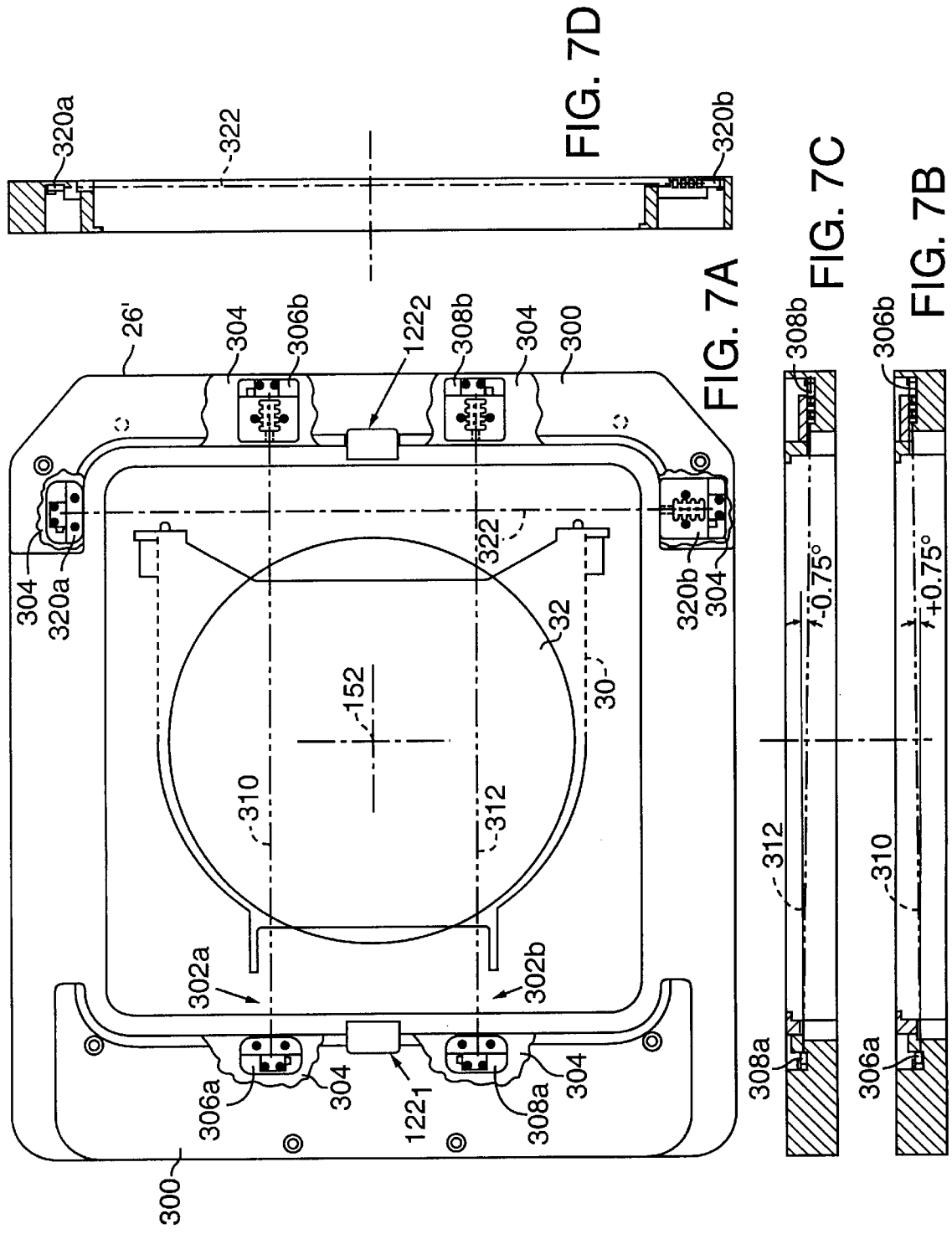

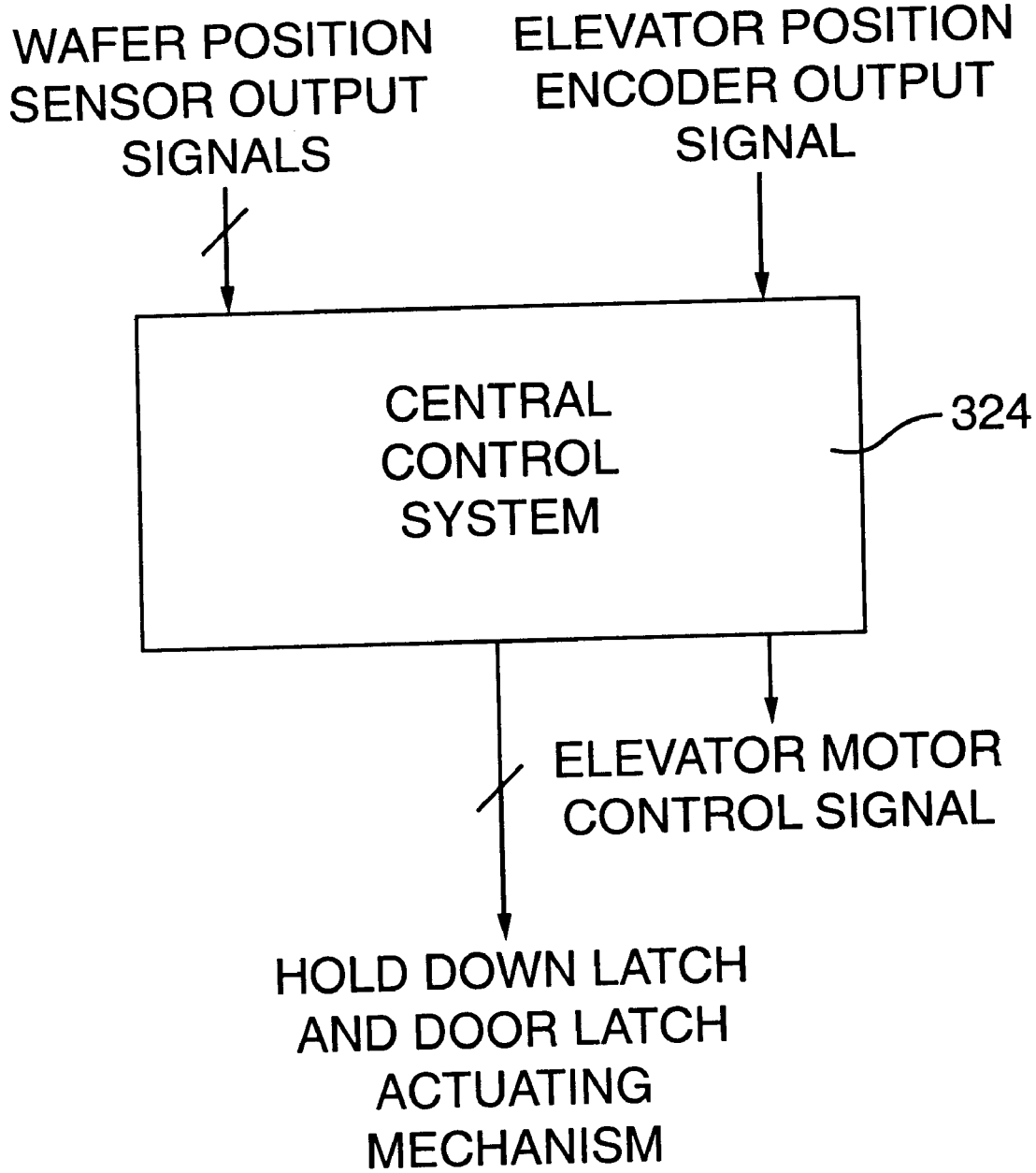

SMIF BOX COVER HOLD DOWN LATCH AND BOX DOOR LATCH ACTUATING MECHANISM

RELATED APPLICATION

This application claims priority from Provisional Patent Application No. 60/092,626, filed Jul. 3, 1998.

TECHNICAL FIELD

The present invention relates to standard mechanical interface (SMIF) system equipment and, in particular, to a SMIF box cover hold down latch and box door latch actuating mechanism that is mechanically timed to maintain synchronism of its box cover hold down latch and box door latch operating positions.

BACKGROUND OF THE INVENTION

A system designed to incorporate SMIF permits handling of semiconductor wafers inside and outside of clean room facilities by interfacing a clean semiconductor wafer cassette transport box or pod to a clean environmental housing for semiconductor processing equipment or to other clean environments. The system concept entails mating a box door on a cassette container box to a port door on an equipment enclosure and transferring the cassette into and out of the processing equipment without exposing to outside contamination the semiconductor wafers carried by the cassette.

A standard interface is required for cassette transport boxes intended to control the transport environment of cassettes containing semiconductor wafers. The standard interface addresses the proper transport box orientation for material transfer and maintains continuity between the transport box and semiconductor processing equipment environment to control particulate matter. The SMIF specifications are set out in the Semiconductor Equipment and Materials International (SEMI) standard SEMI E19.4-94 (1992, 1996).

A SMIF system includes minimum volume, sealed boxes used for storing and transporting semiconductor wafer cassettes, canopies placed over cassette ports and wafer processing areas of semiconductor processing equipment so that the environments inside the boxes and canopies in cooperation with clean air sources become miniature clean spaces, and a transfer mechanism for loading and unloading wafer cassettes from a sealed box without external environment contamination of the wafers carried by the wafer cassette.

Wafers are stored and transported in boxes, and wafers are transferred from one of the boxes to semiconductor processing equipment in the following manner. A box is placed at an interface port on the top or bottom of the canopy covering the processing equipment. The box includes a box cover and a box door designed to mate with a port door on an interface port of the processing equipment canopy. Latches release the box and port doors simultaneously, and the box and port doors are opened simultaneously so that particles present on the external door surfaces are trapped between the box and port doors. A mechanical elevator raises or lowers the box and port doors, with the cassette riding on top, into the canopy covered space. A manipulator picks up the cassette and places it on a cassette port of the processing equipment. After processing has been completed, the reverse of the above-described operation takes place.

FIG. 1 is an exploded view of a prior art box or pod 10 and port assembly 12 of semiconductor processing equipment (not shown). Box 10 is a sealable, transportable container and includes a box cover 14 having an interior region 16. Box 10 has a box door 18 positioned at the bottom of box 10 and mounted by port assembly 12 on the horizontal surface of a canopy of a processing station (not shown) of which the semiconductor processing equipment is a part. Port assembly 12 includes a port plate 26, a port door 28, and an elevator assembly (not shown). The elevator assembly transports a cassette holder 30 (FIG. 2) containing semiconductor wafers 32 (FIG. 2) from interior region 16 of box cover 14 into the region beneath the canopy of the processing station.

Box 10 can be alternately pressurized or evacuated when box cover 14 and box door 18 are sealed together to isolate interior region 16 of box cover 14 from ambient conditions. Port plate 26 is connectable to a coaxial injector/extractor 34 at a gas transfer valve 36 (FIG. 2).

FIG. 2 is a cross sectional view of box 10 mated to port assembly 12. Box 10 is designed to sealably mate with port assembly 12; therefore, box cover 14 has first and second box cover sealing surfaces 44 and 46, respectively. Box door 18 has a first box door sealing surface 48 for sealably mating with first box cover sealing surface 44. A gasket 50 positioned and compressed between surfaces 44 and 48 forms a first seal. Port plate 26 has first and second port plate sealing surfaces 60 and 62, respectively. First port plate sealing surface 60 sealably mates with second box cover sealing surface 46. A gasket 52 positioned and compressed between surfaces 46 and 60 forms a second seal. Port door 28 has a port door sealing surface 64 that sealably mates with second port plate sealing surface 62. A gasket 66 positioned and compressed between surfaces 62 and 64 forms a third seal.

Box cover 14 may include a conduit 68 that defines a channel between gas transfer valve 36 and interior region 16 of box cover 14. A filter 70 positioned at one end of the channel filters fluids such as gases passing through conduit 68.

Port door 28 includes an actuating mechanism having two box door latch pins 72 that project from a top surface 74 of port door 28. Pins 72 mate with a box door latch mechanism located in box door 18 to rotate a cam component of the latch mechanism between two operating positions that secure box door 18 to or release box door 18 from box cover 14 to, respectively, close or open box 10. A box door latch mechanism to which pins 72 are matable in a SMIF box is described in U.S. Pat. No. 4,995,430.

SUMMARY OF THE INVENTION

The present invention includes a SMIF box cover hold down latch and box door latch actuating mechanism that is installed in the port door. Two box door latch actuating pins extend from the actuating mechanism to mate with corresponding holes in the cam component of the box door latch mechanism, such as the one described in U.S. Pat. No. 4,995,430.

In a preferred embodiment, the actuating mechanism comprises a central pivot shaft from which the two box door latch actuating pins extend. The central pivot shaft includes a worm gear sector having worm gear teeth with which a motor-driven worm gear shaft engages to move the central pivot shaft about a central pivot axis between first and second predetermined angular positions. Two rod members pivotally mounted to the central pivot shaft extend in opposite directions and are pivotally connected to different slider assemblies, each of which associated with a box cover hold down latch mechanism. Each slider assembly comprises a truck that is slidably mounted on a rail functioning as a linear guide bearing and has a push pin extending outwardly to contact a corresponding box cover hold down latch mechanism. The rod members respond to pivotal movement of the central pivot shaft between the first and second angular positions by retracting to remove the push pins from and extending to force the push pins against the box cover hold down latches. The central pivot shaft and rod members form, therefore, a slider crank mechanism in which for each rod member one end pivots and the other end linearly translates in response to angular displacement of the central pivot shaft.

In operation, the actuating mechanism moves the central pivot shaft to one or the other of the first and second angular positions. Movement to the first angular position imparts linear movement of the trucks attached to first and second rod members and causes the push pins to retract from their corresponding box cover hold down latches to secure the box cover to the port plate and imparts angular movement to the two actuating pins and causes them to operate the box door latch mechanism to release the box door from the box cover. Movement to the second angular position imparts linear movement to the trucks attached to first and second rod members and causes the push pins to extend toward and contact their corresponding box cover hold down latches to release the box cover from the port plate and imparts angular movement to the two actuating pins and causes them to operate the box door latch mechanism to secure the box door to the box cover.

The invention also includes multiple wafer registration detector subassemblies that ensure the semiconductor wafers are properly stored in the cassette holder before the elevator assembly moves the cassette holder into the region beneath the processing station canopy.

Additional objects and advantages of this invention will be apparent from the following detailed description of a preferred embodiment thereof which proceeds with reference to the accompanying drawings.

BRIEF DESCRIPTION OF THE DRAWINGS

FIG. 7A is a plan view of the present invention with portions of a port door top cover broken away to show three wafer registration detector subassemblies; and FIGS. 7B, 7C, and 7D are diagrams showing the light beam paths of the three detector subassemblies.

FIG. 10 is a simplified block diagram showing the input signals to and output signals from a central control system that coordinates the operations of the various components of the box cover hold down latch and box door latch actuating mechanism of the invention.

DETAILED DESCRIPTION OF A PREFERRED EMBODIMENT

Figures 1, 3:
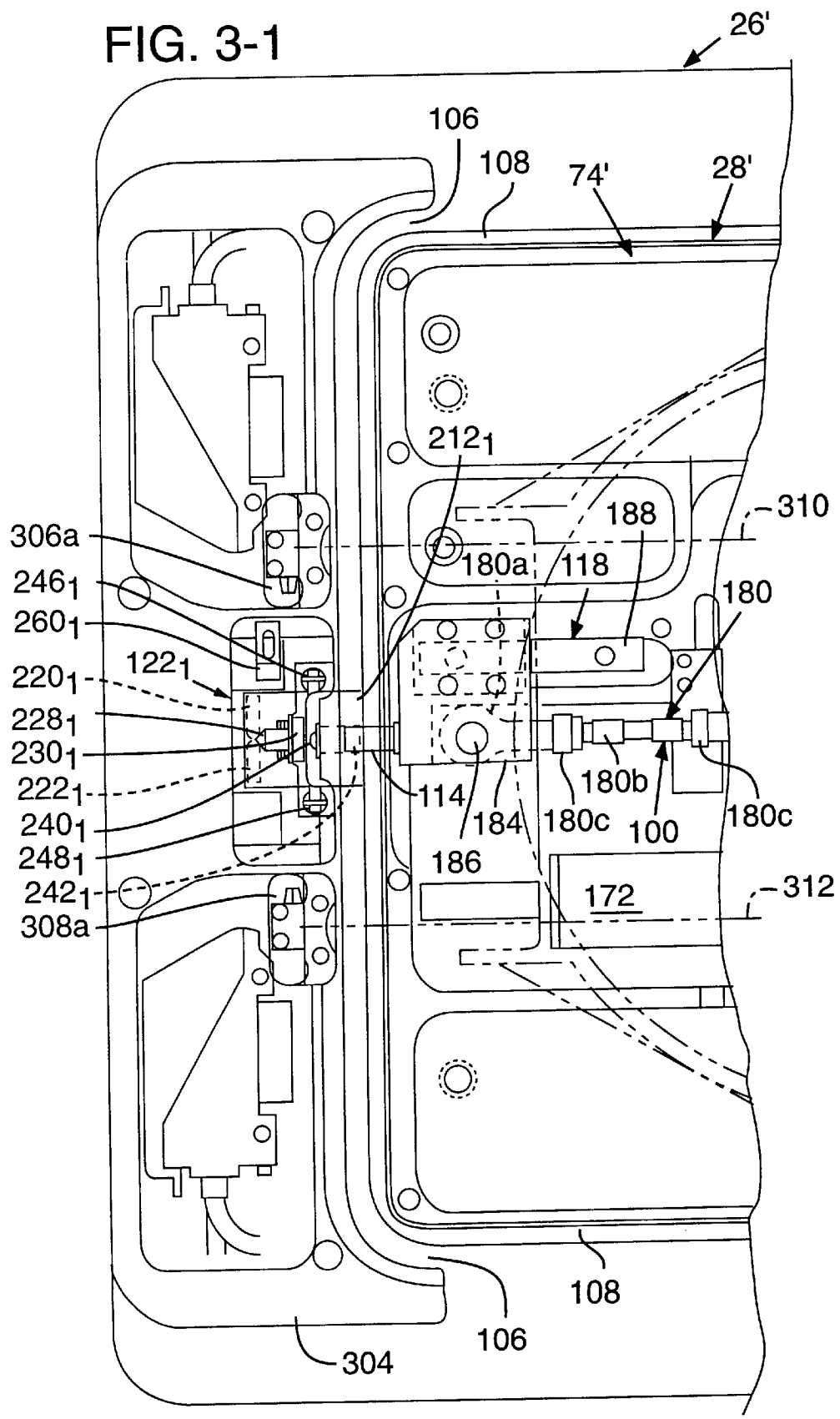
FIG. 1 is an exploded isometric view of a prior art SMIF box and portions of a port assembly for receiving the SMIF box.
FIG. 3, which is divided into two parts (FIGS. 3-1 and 3-2) for clarity, is a plan view of the components of the actuating mechanism of the present invention positioned in the interior of a port door shown with its top cover removed and within the central opening of a port plate.

FIGS. 3, 4A, 4B, and 5 show a box cover hold down latch and box door latch actuating mechanism 100 of the present invention. With reference to FIGS. 3, 4A, 4B, and 5, actuating mechanism 100 is contained within a port door 28' that fits within a rectangular central opening in a port plate 26'. (Reference numerals followed by primes designate components that correspond to but are not necessarily identical with prior art components shown in FIGS. 1 or 2.) Box door 18 of a standard SMIF box 10 fits on a top surface 74' of port door 28' and has three openings (not shown) that receive corresponding ones of three registration pins 104 to assume a predetermined orientation in accordance with the SMIF standard. Second box cover sealing surface 46 of box cover 14 fits into a recess 106 extending around an inner side margin 108 defining the central opening in port plate 26'. Two box latch pins 72' extend from a top surface 110 of a central pivot shaft 112 and function as a coupling element to the box door latch mechanism of box 10 positioned on port door 28'. Two push pins 114 and 116 extending outwardly of two slider assemblies 118 and 120 in opposite directions actuate respective box hold down latch mechanisms $122_1$ and $122_2$ for box cover 14. Hold down latch mechanisms $122_1$ and $122_2$ are of the same mechanical design and are positioned on opposite sides and at the top of port door 28'.

Two box presence switches 126 and 128 positioned on opposite sides and at the top of port door 28' have plunger pins 130 and 132 that depress under the weight of box 10 when it is seated properly on port door 28' to enable full operation of actuating mechanism 100. When box 10 is not properly seated on port door 28', presence switches 126 and 128 disable an elevator 134 (FIG. 9) on which port door 28' is mounted and thereby prevent downward travel of port door 28' to maintain the seal between it and the port plate 26' to maintain the integrity of the environment under the SMIF system canopy (not shown).

Figure 4A:
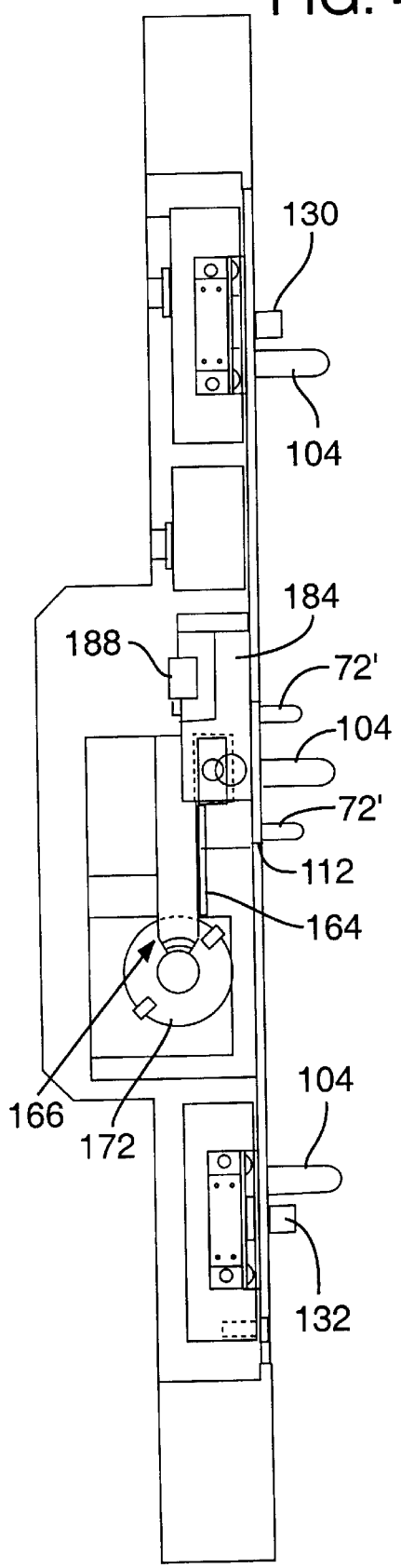
FIGS. 4A and 4B are respective left- and right-hand side elevation views of the actuating mechanism of FIG. 3 depicted with the side surface covers of the port door removed to show interior detail.
Figure 4B:
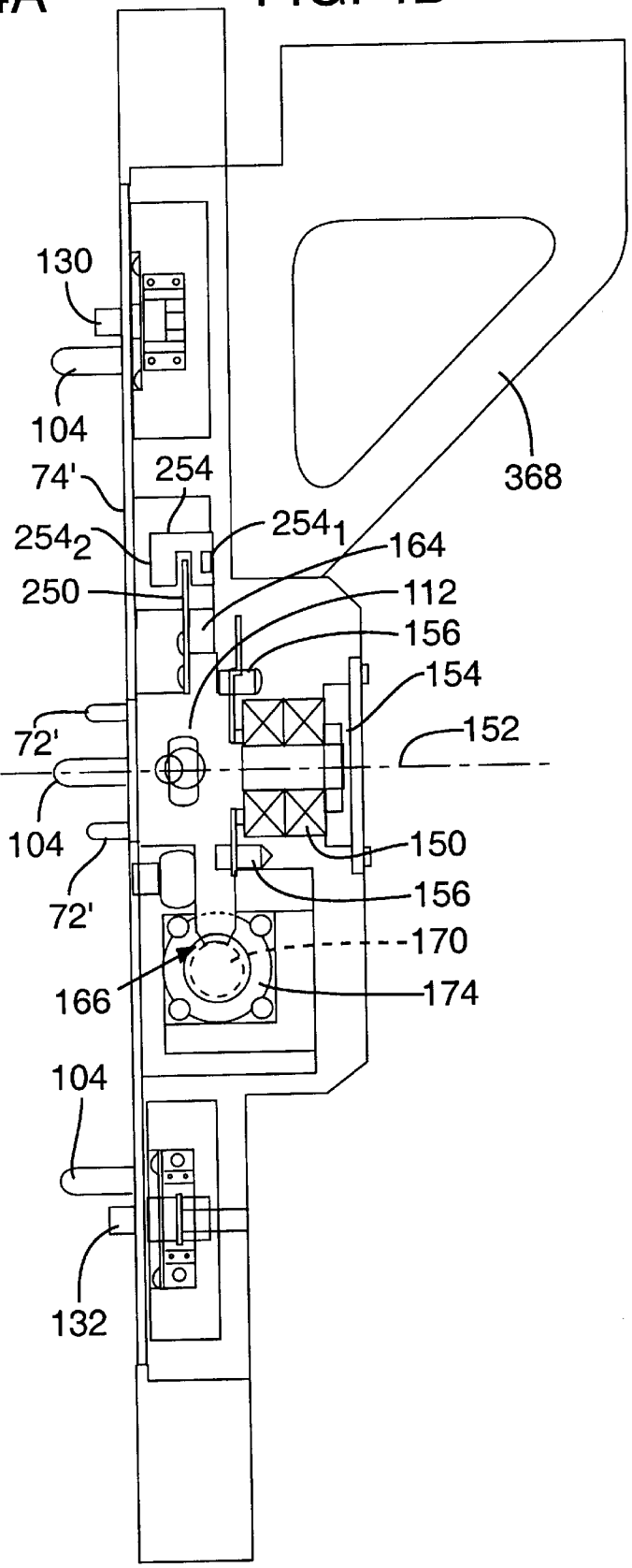

The operating positions of box cover hold down latch mechanisms $122_1$ and $122_2$ and the box door latch mechanism of box door 18 are determined by the angular positions of central pivot shaft 112. Central pivot shaft 112 is journalled in support bearings 150 for pivotal movement about a central pivot axis 152. Bearings 150 are secured to a bottom surface 154 in the center of the interior of port door 28', as best seen in FIG. 4B. Two stationary pins 156 and 158 inserted in port door 28' extend through respective arcuate travel hard stop slots 160 and 162 in a disk member 164 forming a widened portion of the end of pivot shaft 112 near bearings 150. Slots 160 and 162 are sufficiently wide to receive the respective pins 156 and 158 and provide an 86° angular displacement travel limit to central pivot shaft 112 about its pivot axis 152 to sequentially move between the first and second angular positions specified by the SMIF standard. Disk member 164 of central pivot shaft 112 includes a worm gear section 166 having worm gear teeth 168 with which a worm gear shaft 170 driven at one end by a motor 172 and terminated at the other end in a bearing 174 engages to move central pivot shaft 112 about central pivot axis 152 between the first and second angular positions.

Figure 5:
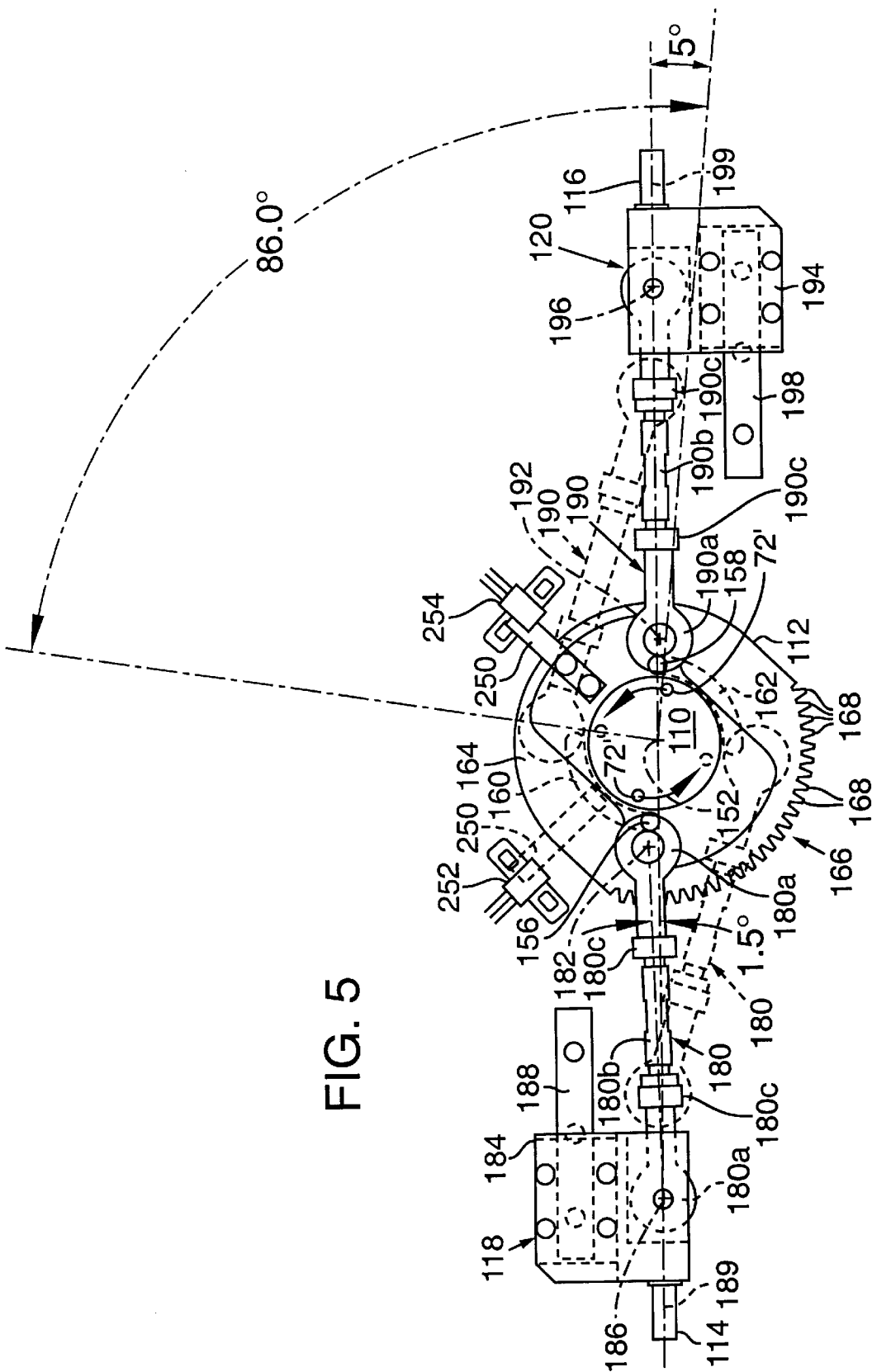
FIG. 5 is an enlarged view of the slider crank mechanism showing in phantom lines the positions of the pivot pins and rod members for a first angular position of the pivot shaft and in solid lines the positions of the pivot pins, rod members, and slider assemblies for a second angular position of the pivot shaft.

A first elongated coupling or rod member 180 of adjustable length is mounted at its proximal end to disk member 164 for pivotal movement about a first rod pivot axis 182 and at its distal end to a truck 184 of slider assembly 118 for pivotal movement about a second rod pivot axis 186. Rod member 180 is composed of a spherical joint 180a and a turnbuckle portion 180b coupled at each of its ends by locknuts 180c that after rotary adjustment fix the length of rod member 180. Truck 184 slides along a rail 188 that functions as a linear guide bearing and defines for push pin 114 a line of travel 189 (FIG. 5). A second elongated coupling or rod member 190 of adjustable length is mounted at its proximal end to disk member 164 for pivotal movement about a first rod pivot axis 192 and at its distal end to a truck 194 of slider assembly 120 for movement about a second rod pivot axis 196. Rod member 190 is composed of a spherical joint 190a and a turnbuckle portion 190b coupled at each of its ends by locknuts 190c that after rotary adjustment fix the length of rod member 190. Truck 194 slides along a rail 198 that functions as a linear guide bearing and defines for push pin 116 a line of travel 199 (FIG. 5). Rods 188 and 198 are aligned so that lines of travel 189 and 199 of the respective push pins 114 and 116 are collinear.

Spherical joints 180a and 190a facilitate the length adjustments of the respective rod members 180 and 190 without disassembly by rotation of turnbuckle portions 180b and 190b but are otherwise not needed to practice the invention. Rod pivot axes 182 and 192 are positioned on opposite sides of and are preferably collinear with central pivot axis 112 in the plane of FIG. 3. In a preferred implementation, rod pivot axes 182 and 192 are positioned on central pivot shaft 112 to meet the following two criteria, as shown in FIG. 5. First, in the second angular position, lines of travel 189 and 199 are offset by 5° from, respectively, a line connecting central pivot axis 152 and first rod pivot axis 182 and a line connecting central pivot axis 152 and first rod pivot axis 192. Second, in the second angular position, lines of travel 189 and 199 are offset by 1.5° from, respectively, a first rod center line connecting first and second rod pivot axes 182 and 186 and a second rod center line connecting first and second rod pivot axes 192 and 196. The 1.5° offsets of the first and second rod center lines effectively lock rod members 180 and 190 in the second angular position to impede any unauthorized attempt to forcibly retract them from their extended positions.

Figure 6A:
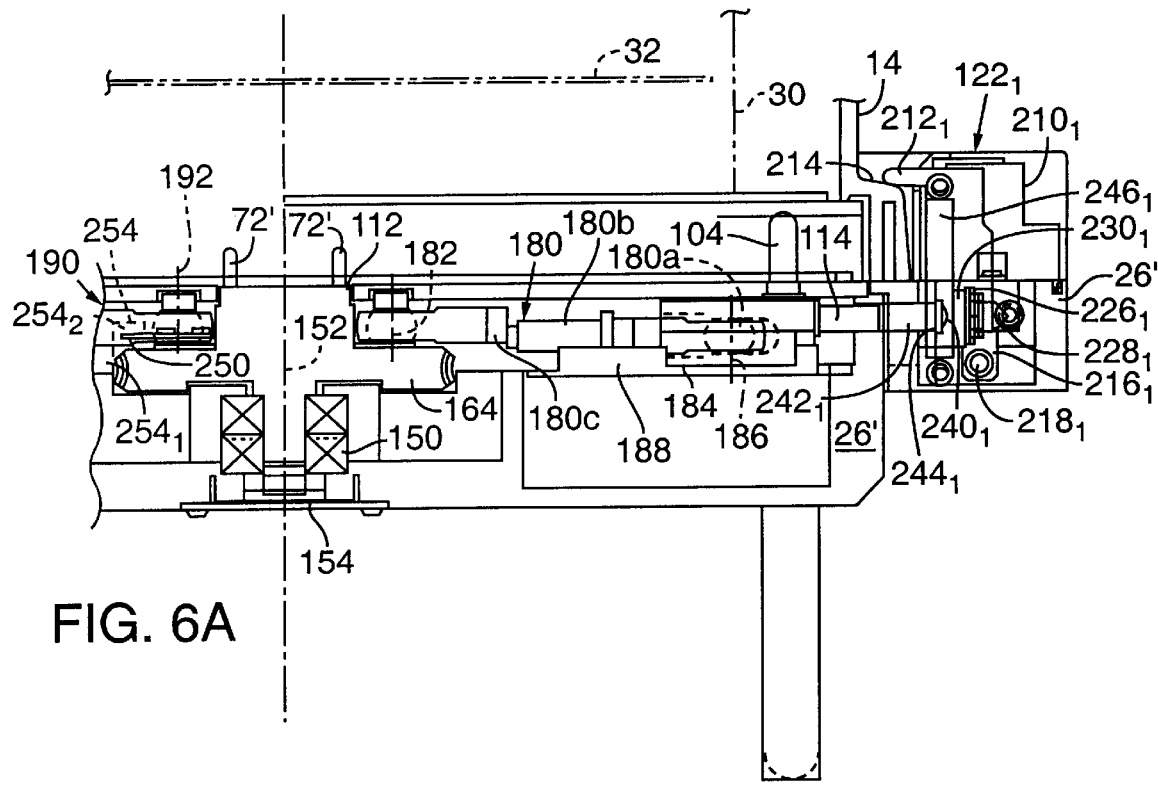
FIGS. 6A, 6B, and 6C are, respectively, rear side, plan, and end views showing partly in cross-section one of two box hold down latch mechanisms of the present invention.
Figure 6B:
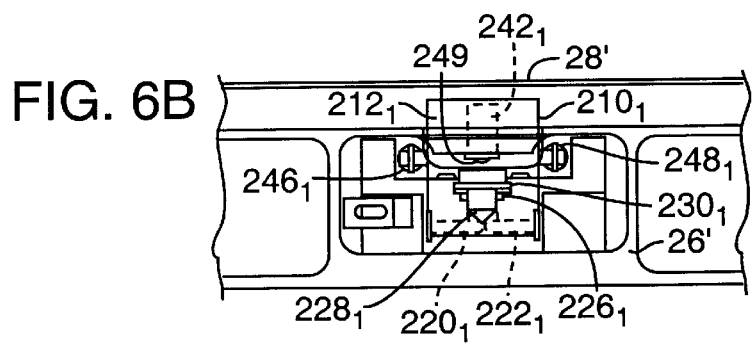
Figure 6C:
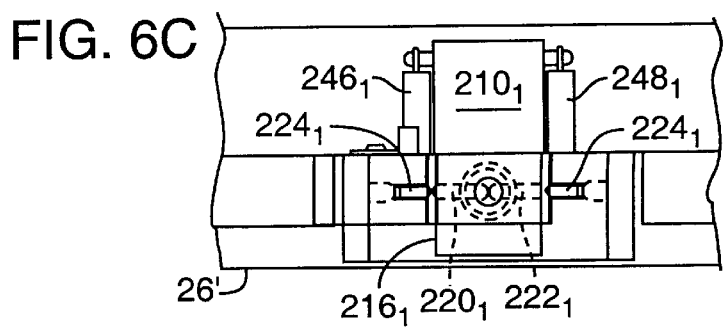

FIGS. 6A, 6B, and 6C show respective rear side, plan, and end views of box hold down latch mechanism $122_1$. Because box hold down latch mechanisms $122_1$ and $122_2$ are of the same design, the following description is directed only to latch mechanism $122_1$ but is similarly applicable to latch mechanism $122_2$.

With reference to FIGS. 3, 6A, 6B, and 6C, latch mechanism 122, includes a latch $210_1$ having at a free end a tongue portion $212_1$ that fits over a shoulder 214 of box cover 14 and at an end concealed in port plate 26' a pivot portion $216_2$ that receives a latch pivot pin $218_1$ secured in the interior of port plate 26'. Springloaded unlocking pins $220_1$ and $222_1$ positioned outside of latch $210_1$ and mounted in channels $224_1$ in port plate 26' are biased to touch each other in a rest state and thereby prevent latch $210_1$ from pivoting about latch pivot pin $218_1$ and hold box cover 14 down against port plate 26'.

Latch $210_1$ has a stepped hole $226_1$ through which a pointed end $228_1$ of an unlocking cam $230_1$ can extend outwardly to contact and laterally spread apart unlocking pins $220_1$ and $222_1$ to provide clearance for latch $210_1$ to move about pivot pin $218_1$. Unlocking cam $230_1$ has a bearing surface and slides along the stepped interior of hole $226_1$ in response to force applied by a rounded end $240_1$ of a piston $242_1$ that slides along the length of and projects out of a hole $244_1$ in port plate 26' to contact unlocking cam $230_1$. Push pin 114 contacts and applies a pushing force to piston $242_1$ and thereby retracts latch $210_1$ in response to the pivotal movement of central pivot shaft 112 to the second angular position, in which retraction of latch $210_1$ releases box cover 14 from port plate 26'.

Coiled extension springs $246_1$ and $248_1$ mounted on either side of latch $210_1$ between attachment points on tongue portion $212_1$ and on port plate 26' near pivot portion $216_1$ apply a constant restorative force that urges tongue portion $212_1$ against box cover 14.

Thus, latch actuating mechanism 100 is designed with an inherent mechanical interlock that maintains the synchronism of the two angular (i.e., locking) positions. The mechanical timing cannot be defeated to break the timing sequence and therefore facilitates environmental contamination prevention.

Actuating mechanism 100 operates to move central pivot shaft 112 between the first and second angular positions to turn box door latch pins 72' and to actuate box hold down latch mechanisms $122_1$ and $122_2$ as follows.

Whenever central pivot shaft 112 is oriented in the first angular position as shown in phantom lines in FIG. 5, box door latch pins 72' are oriented to set the box door latch mechanism in a box door unlocked position and rod members 180 and 190 in a retracted position that positions push pins 114 and 116 a distance away from and not in contact with pistons $224_1$ and $242_2$ of the respective box hold down latch mechanisms $122_1$ and $122_2$. Thus, box hold down latch mechanisms $122_1$ and $122_2$ hold the respective latches $210_1$ and $210_2$ against box cover 14 to secure it to port plate 26'. Unlocking pins $220_1$ and $222_1$ and unlocking pins $220_2$ and $222_2$ prevent forcible leverage of the respective latches $210_1$ and $210_2$ in an attempt to remove box cover 14 without authorization.

Whenever central pivot shaft 112 is oriented in the second angular position as shown in solid lines in FIG. 5, box door latch pins 72' are oriented to set the box door latch mechanism in a box door locked position and rod members 180 and 190 in a fully extended position that urges push pins 114 and 116 against the respective pistons $242_1$ and $242_2$ to cause unlocking cam $230_1$ to force apart unlocking pins $220_1$ and $222_1$ and thereby release latches $210_1$ and $210_2$ from box cover 14.

Figures 2, 3:
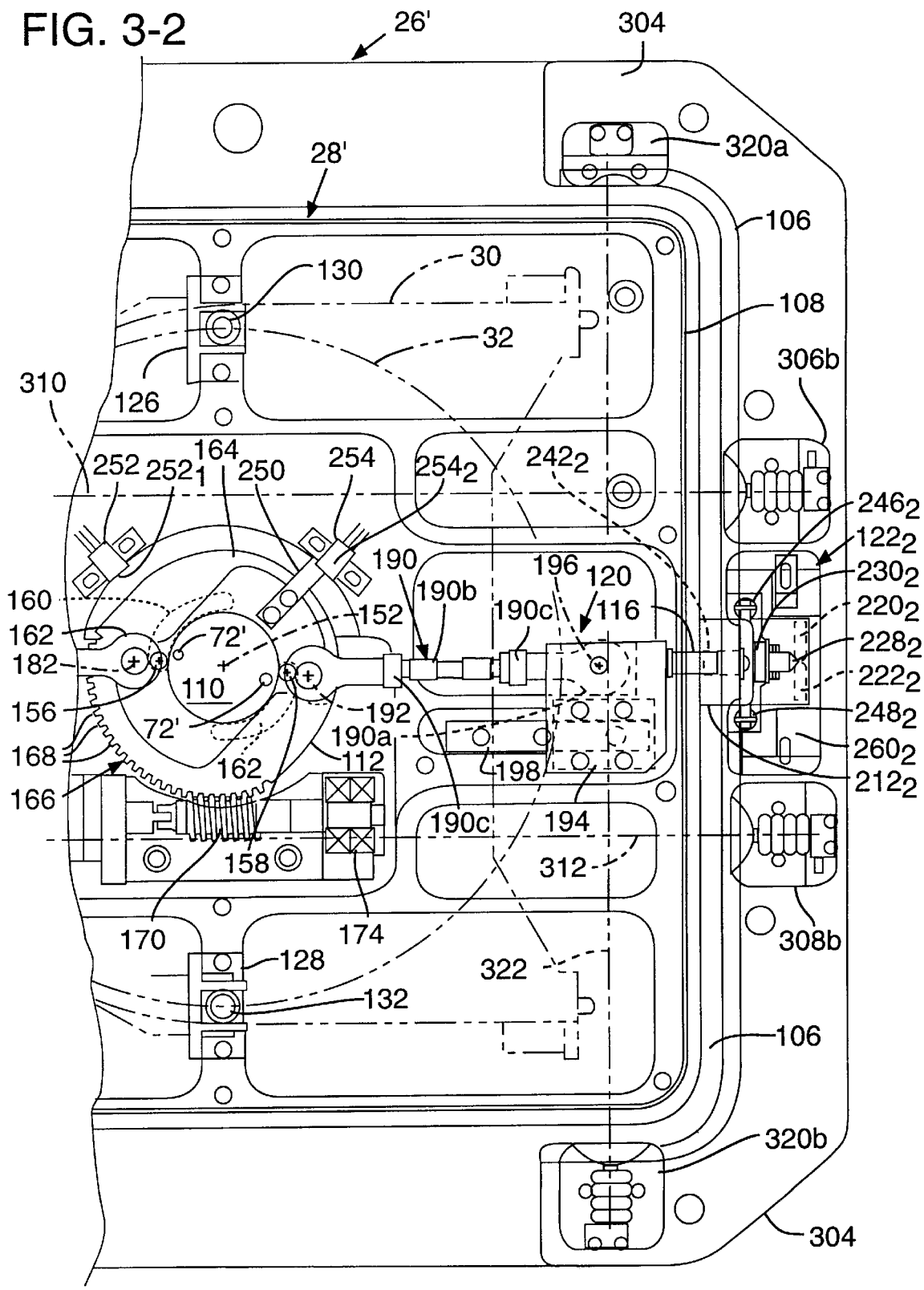
FIG. 2 is a sectional view taken along lines 2—2 of FIG. 1.

With particular reference to FIGS. 3, 4B, and 5, a light beam interrupting vane 250 extends from disk member 162 for movement between an emitter leg $252_1$ and a sensor leg $252_2$ and between an emitter leg $254_1$ and a sensor leg $254_2$ of respective U-shaped transmissive optical interrupter devices 252 and 254 mounted to port door 28'. Optical interrupter devices 252 and 254 function as sector control end of travel switches that indicate whether central pivot shaft 112 is in the first or second angular position. The presence of vane 250 in either of interrupter devices 252 and 254 stops the operation of motor 172 in response to its reaching an end of travel point. Skilled persons will appreciate that an advantage of the invention is that a single motor 172 or activator controls one unitary mechanism operating as a "bang-bang" device between two angular positions and using end point detection.

With particular reference to FIG. 3, reflective optical switches $260_1$ and $260_2$ detect when light emitted by them is reflected by the respective latches $210_1$ and $210_2$ to indicate they are not pivotally displaced and they are thereby securing box cover 14 to port plate 26'.

FIG. 7A is a plan view of the present invention with portions of a port door top cover 300 broken away to show three wafer registration detector subassemblies; and FIGS. 7B, 7C, and 7D are diagrams showing the placement of the components of the detector subassemblies and their corresponding light beam paths from which wafer registration data are derived. With reference to FIGS. 3 and 7A, differential optical scanning wafer registration detector subassemblies 302a and 302b are mounted on a top surface 304 of port plate 26' to detect the orientation of a wafer 32 stored in a slotted cassette holder 30 as elevator 134 descends to enable a wafer scanning operation. Detector subassembly 302a includes a light beam sensor 306a and a light beam emitter 306b, and detector subassembly 302b includes a light beam sensor 308a and a light beam emitter 308b.

Light beam sensors 306a and 308a are positioned on either side of hold down latch mechanism $122_1$, and light beam emitters 306b and 308b are positioned on either side of hold down latch mechanism $122_2$. Sensors 306a and 308a and emitters 306b and 308b are located outside of the region where a box cover 14 would occupy and are aligned to form two plane parallel light propagation paths 310 and 312, the former between sensor 306a and emitter 306b and the latter between sensor 308a and emitter 308b, that extend through openings in a cassette holder 30 carried in a box 10. (FIG. 3 shows in phantom lines a wafer 32 seated in a cassette holder 30 that is properly registered in a SMIF box 10.) The presence of a wafer 32 aligned to intersect one or both light propagation paths 310 and 312 interrupts light propagating from one or both of emitters 306b and 308b from reaching its corresponding sensor 306a and 308a. Thus, interruption of one or both of the light propagation paths provides information that can be used to position a wafer handler for wafer pickup or to determine the presence or absence of a wafer 32 in a slot in cassette holder 30, whether two wafers 32 occupy the same slot in cassette holder 30, or whether a wafer 32 occupies two slots (i.e., in a cross slot position) in cassette holder 30. The mounting configuration and operation of light beam sensors 306a and 308a and emitters 306b and 308b are described below with particular reference to FIGS. 7B, 7C, and 7D.

Figure 8:
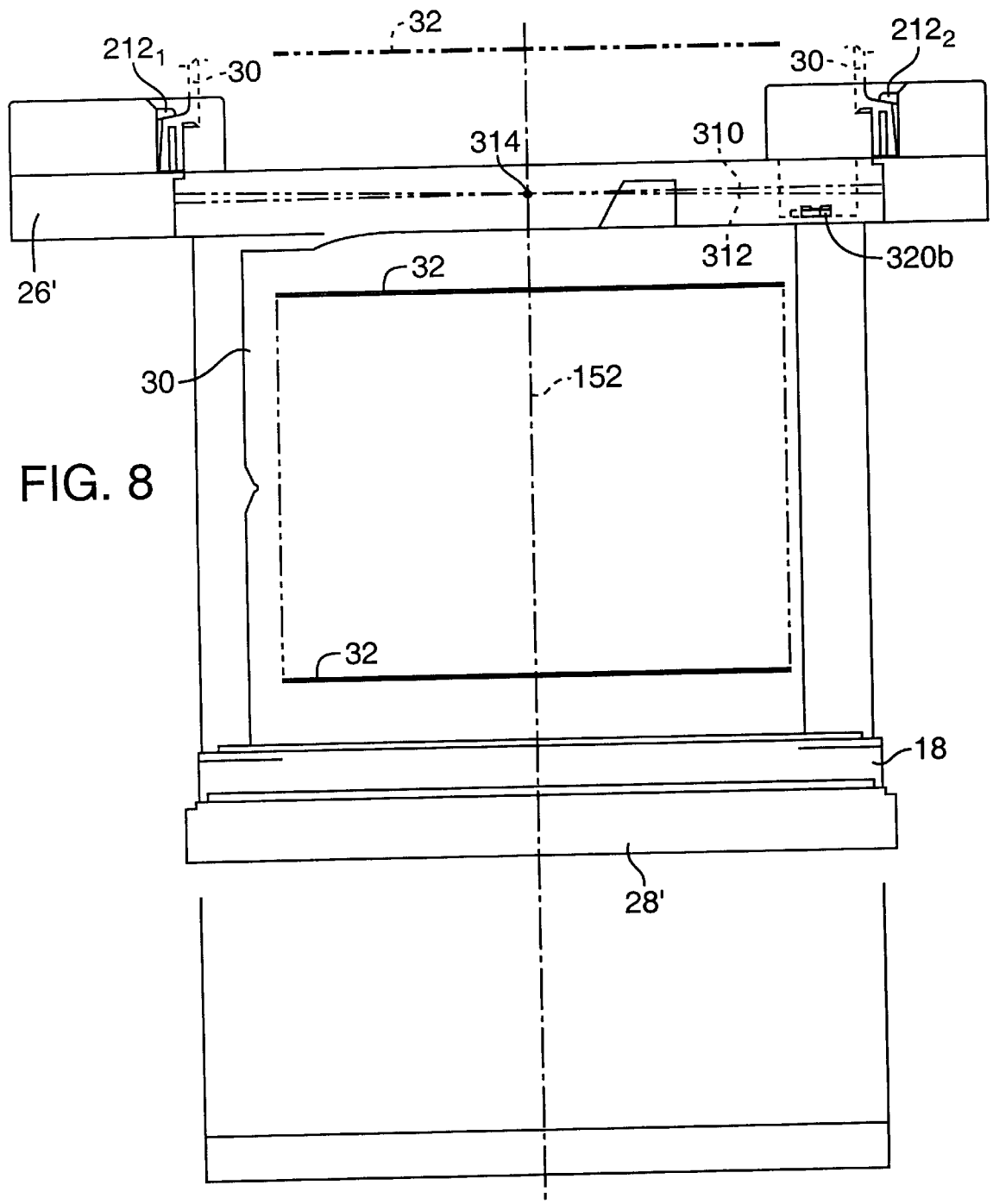
FIG. 8 is a diagram showing a side elevation view of the placement of a wafer cassette on a port-plate (with the position of a properly registered semiconductor wafer shown in phantom) relative to the crossed beam paths of the detector subassemblies shown in FIGS. 7B and 7C.

Sensor 306a and emitter 306b are secured to top surface 304 of port plate 26' in slightly upwardly beveled mounting surface areas that provide a straight line light beam path 310 inclined at a +0.75° angle relative to the plane of top surface 304. Sensor 308a and emitter 308b are secured to top surface 304 of port plate 26' in slightly downwardly beveled mounting surface areas that provide a straight line light beam path 312 inclined at a −0.75° angle relative to the plane of top surface 304. FIG. 8 is a diagram showing a side elevation view of the placement of wafer cassette holder 30 on port plate 26' relative to crossed light beam paths 310 and 312. Beam paths 310 and 312 are parallel in spaced-apart vertical planes and are angularly inclined in opposite directions to crossover at a point 314 along central pivot axis 152 in a horizontal plane defined by top surface 304. FIG. 8 also shows in phantom lines a semiconductor wafer 32 positioned above cassette holder 30 and in a location representing proper registration of wafer 32 in holder 30.

Figure 9:
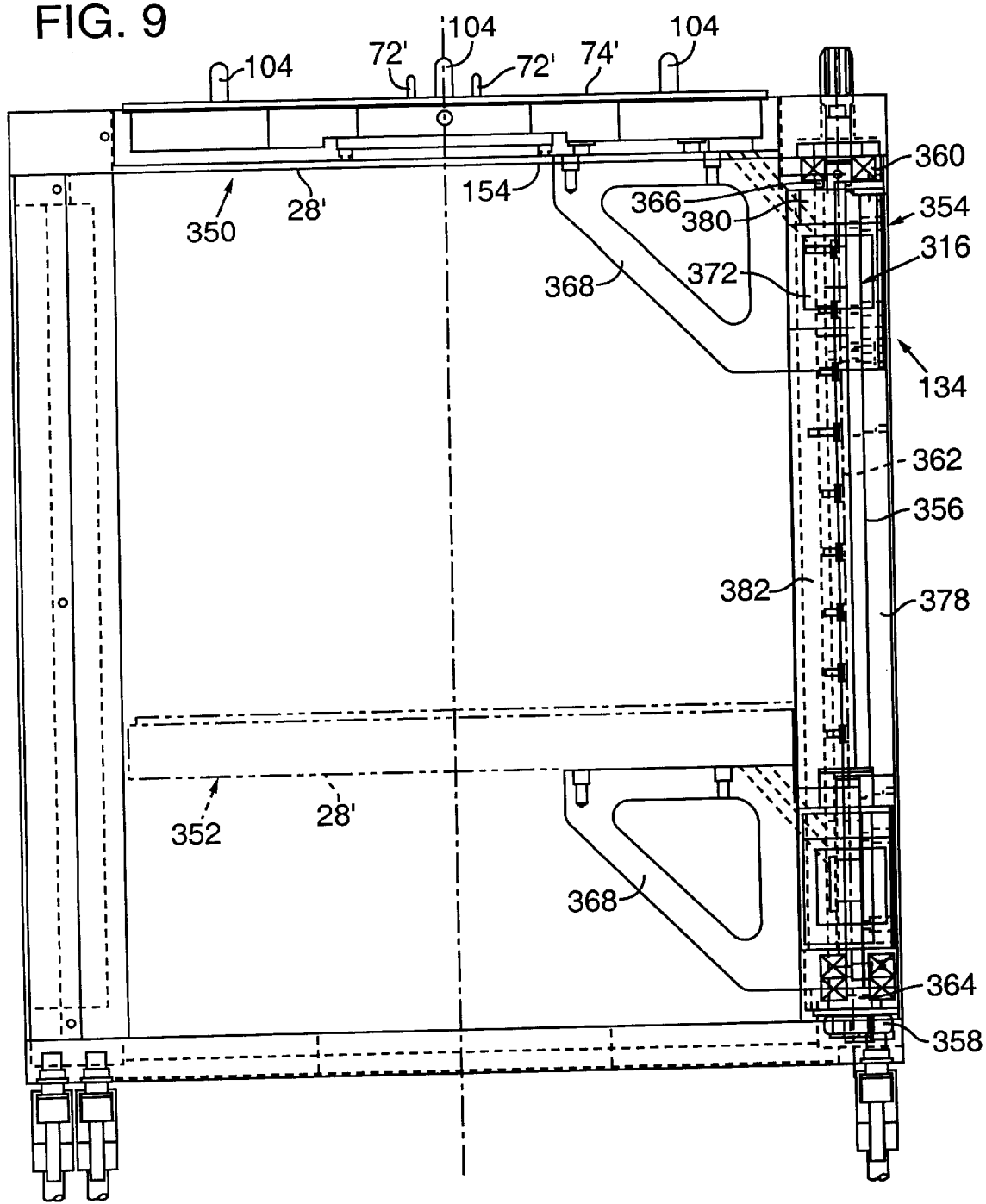
FIG. 9 is a side elevation view of the elevator that raises and lowers a cassette holder after it has been secured to the port plate.

The light beam paths are angularly inclined so that a single wafer 32 properly registered in a wafer cassette slot and in a specified elevator position interrupts both beams equally. As shown in FIG. 9 and described in greater detail below, cassette holder 30 is supported on elevator 134, the vertical position of which is measured by an optical position encoder 316. The movement of elevator 134 provides a continuous scan of the contents of cassette holder 30. As elevator 134 travels to the next specified elevator position, sensors 306a and 308a produce output signals of equal magnitude for an elevator displacement equal to the wafer thickness. (The same wafer thickness is measured by the corresponding sensors and emitters for light beam paths 310 and 312 when wafer 32 is registered in its slot.) The magnitudes of the signals will change but the difference between the signals will not change as elevator 134 moves to the next specified elevator position.

A wafer 32 in cross slot position will interrupt only one beam for a specified elevator position and thereby cause sensors 306a and 308a to produce output signals of different magnitudes. The sensor output that indicates the presence of incident light represents the open slot and thus the direction of the horizontal tilt angle of wafer 32.

The common mode rejection properties of differential optical scanning wafer registration detector subassemblies 302a and 302b reject signal perturbations caused by mechanical vibrations and provide for accurate individual wafer thickness pitch angle measurements. (The pitch angle represents the angular offset of the wafer relative to the desired plane of the wafer, i.e., the plane defined by light beam paths 310 and 312.) Two wafers 32 occupying the same slot will interrupt both light beams 310 and 312 for a specified elevator position; however, the magnitudes and difference between the signals will not change for a longer than nominal vertical displacement of elevator 134 as it moves to the next specified elevator position.

The continuous signal interruption indicates a greater than nominal wafer thickness in a slot and thereby represents double wafer occupancy of a slot.

A light beam sensor 320a and emitter 320b form a light propagation path 322 in a transverse (preferably perpendicular) direction to that of the parallel light paths 310 and 312 described above. Sensor 320a and emitter 320b are positioned at the corners of port plate 26' near the side where emitters 306b and 308b are located and outside of the region where a box cover 14 would occupy to detect whether a wafer 32 has been dislodged to protrude from its slot in the front opening of holder 30. A dislodged wafer 32 descending out of box cover 14 would interrupt light propagation path 322 to provide a signal that disables elevator 134 from descending farther and thereby prevent the protruding wafer 32 from striking port plate 26' as cassette holder 30 is lowered. As indicated in FIG. 10, the output signals of sensors 306a, 308a, and 320a and of position encoder 316 are processed by a central control system 324 to make the above-described wafer registration determinations.

FIG. 9 shows elevator 134 supporting port door 28' in a fully raised position (solid lines) 350 and a fully lowered position (outlined in phantom lines) 352. Elevator 134 comprises a side drive lead screw mechanism 354 that includes a lead screw 356 driven at a lower end by a smooth running, high torque, DC motor 358 and supported at an upper end by bearings 360 for rotation about a longitudinal axis 362. Numerous servo motors are known in the art, are commercially available, and would be suitable. Motor 358 is in communication with and controlled by an input controller that generates input command voltage signals. The input controller forms a part of central control system 324, which directs the operation of the hold down latch and door latch actuating mechanism of the present invention. Input command signals delivered to motor 358 are converted to rotation of a motor drive output shaft 364. Motor 358 provides bi-directional rotational output, reflecting the polarity of the voltage input signal. Motor drive output shaft 364 is operatively connected to lead screw 356. Rotation of motor drive output shaft 364 results in corresponding rotation of lead screw 356. A lead nut assembly 366 is threaded on lead screw 356 and operatively connected to a mounting bracket 368 connected to bottom surface 154 of port door 28' and lead screw 356. Rotation of lead screw 356 results therefore in linear displacement of lead nut assembly 366 along the length of lead screw 356. This results in linear displacement of mounting bracket 368 to raise or lower port door 28' to perform a wafer scanning operation.

Optical position encoder 316 continuously monitors and provides feedback as to the position of lead nut assembly 366 and thereby the positions of wafers 32 stored in cassette holder 30 mounted to port door 28'. An encoder carriage 372 is mounted in fixed relation to and thus moves in concert with lead nut assembly 366. Encoder carriage 372 provides a housing for movable components of optical position encoder 316 as well as a mounting member for scanning frame guide rods 374 supporting the scanning frame. Wafer cassette holder 30 is displaced as a consequence of the displacement of encoder carriage 372 caused by rotation of lead screw 356.

Encoder carriage 372 is slidably mounted on stationary vertical support plates by means of high precision, low friction linear bearing assemblies 378 (only one shown) arranged in parallel to longitudinal axis 362. Linear bearing assemblies 378 preferably extend for the full length of travel of lead nut assembly 366 and thereby positively guide encoder carriage 372 along the full length of its travel path. Various types of position encoders and devices for continuously monitoring and providing feedback relating to the displacement of lead nut assembly 366 and encoder carriage 372 are known in the art and would be suitable. Optical encoder assemblies are generally preferred, and encoders that operate using Moire fringe pattern principles to continuously monitor the position of encoder carriage 372 are especially preferred.

Optical position encoder 316 includes a read head mounting member 380 on which an array of light emitting diodes is mounted. A reference grating is rigidly mounted on read head mounting member 380, and a stationary grating 382 extends along the full length of travel of encoder carriage 372. The structural design and functions of read head mounting member 380 and stationary grating 382 that operate using Moire fringe pattern principles are known and described in commonly assigned U.S. Pat. No. 5,382,806.

It will be obvious to those having skill in the art that many changes may be made to the details of the above-described embodiment of this invention without departing from the underlying principles thereof. For example, a drive actuator other than motor 172 could turn central pivot shaft 112 to operate the actuating mechanism. The scope of the present invention should, therefore, be determined only by the following claims.

What is claimed is:

1. In a standard mechanical interface (SMIF) system including a transport box comprising a box cover and a removable box door that opens and closes the box, a box door latch mechanism operatively connected to a latch actuating coupler to releasibly secure the box door to the box cover, a port plate to which first and second box cover hold down latches are mounted to secure the box cover to the port plate when the box door is released from the box cover, and a retractable port door attachable to the box door to selectively move the box door toward or away from the box cover to thereby open or close it, a box cover hold down latch and box door latch actuating mechanism mounted within the port door and comprising:

a central pivot shaft movable about a pivot shaft axis and including a coupling element that is drivingly engageable with the latch actuating coupler of the box door latch mechanism;

first and second elongate coupling members extending in different directions from the pivot mount, the first coupling member having a first end pivotally mounted to the pivot shaft and a second end responding to pivotal movement of the pivot shaft to actuate the first box cover hold down latch, and the second coupling member having a first end pivotally mounted to the pivot shaft and a second end responding to pivotal movement of the pivot shaft to actuate the second box cover hold down latch; and a drive actuator operatively connected to the pivot shaft to turn it about the pivot shaft axis for movement between first and second angular positions, the first angular position resulting in positioning the second ends of the first and second coupling members to cause the respective first and second box cover hold down latches to secure the box cover to the port plate and in positioning the coupling element in engagement with the latch actuating coupler to cause the box door latch mechanism to release the box door from the box cover, and the second angular position resulting in positioning the second ends of the first and second coupling members to cause the respective first and second box cover hold down latches to release the box cover from the port plate and in positioning the coupling element in engagement with the latch actuating coupler to cause the box door latch mechanism to secure the box door to the box cover.

2. The actuating mechanism of claim 1 in which the pivot shaft comprises a worm gear sector having worm gear teeth and in which the drive actuator comprises a motor having a worm gear shaft that engages the worm gear teeth to pivotally move the pivot shaft between the first and second angular positions.

\* \* \* \* \*

UNITED STATES PATENT AND TRADEMARK OFFICE
CERTIFICATE OF CORRECTION

PATENT NO.   : 6,160,265
DATED        : December 12, 2000
INVENTOR(S)  : Paul Bacchi and Paul S. Filipski It is certified that error appears in the above-identified patent and that said Letters Patent is hereby corrected as shown below:

Title page,
Left-hand column (top), should read:
-- MULTIPLE WAFER REGISTRATION DETECTING DEVICE WITH PLURAL INCLINED BEAM PATHS --.

Column 5,
Line 62, "122," should read -- $122_1$ --.
Line 64, "$216_2$" should read -- $216_1$ --.

Claim 1, column 10,
Lines 8-52, should read:
1. A differential optical signal scanning assembly for vibration immune detection of the positions of multiple specimens stored in a spaced-apart, stacked arrangement in a container, comprising:
   a first light emitter and a first light sensor spaced apart to produce a first straight line light beam path that is inclined at a first angle relative to a reference datum plane;
   a second light emitter and a second light sensor spaced apart to produce a second straight line beam path that is inclined at a second angle relative to the reference datum plane, the first and second light sensors producing respective first and second output signals, and the first and second light beam paths inclined at respective first and second angles of known rotational sense;
   a positioning mechanism for imparting controlled relative movement between the specimens stacked in the container and the first and second light sensors and the first and second light emitters, the relative movement taking place with the container occupying a space between the first and second light emitters and the first and second light sensors and along a plane transverse to the reference datum plane;
   a position tracking device responsive to the relative movement to provide information from which positions of the specimens stored in the container can be derived; and
   a signal processor receiving and taking the difference of the first and second output signals produced by the respective first and second light sensors as the specimens interrupt the first and second beam paths in response to the relative movement, the signal processor cooperating with the position tracking device to provide position and orientation information about the specimens stored in the container.

UNITED STATES PATENT AND TRADEMARK OFFICE
CERTIFICATE OF CORRECTION

PATENT NO. : 6,160,265
DATED : December 12, 2000
INVENTOR(S) : Paul Bacchi and Paul S. Filipski It is certified that error appears in the above-identified patent and that said Letters Patent is hereby corrected as shown below:

<u>Claim 2, column 10,</u>
Lines 53-58, should read:
2. The scanning assembly of claim 1 in which a positioning device imparts movement to the container to cause the relative movement and the position tracking device provides information corresponding to positions of the container as it moves.

Signed and Sealed this

Sixth Day of November, 2001

Attest:

*Nicholas P. Godici*

NICHOLAS P. GODICI
*Acting Director of the United States Patent and Trademark Office*

*Attesting Officer*